United States Patent [19]
Taguchi

[11] Patent Number: 5,241,208
[45] Date of Patent: Aug. 31, 1993

[54] SEMICONDUCTOR DEVICE COMPRISING AN ANALOGUE ELEMENT AND A DIGITAL ELEMENT

[75] Inventor: Minoru Taguchi, Omiya, Japan

[73] Assignee: Kabushiki Kaisha Toshiba, Kawasaki, Japan

[21] Appl. No.: 755,784

[22] Filed: Sep. 6, 1991

[30] Foreign Application Priority Data

Sep. 12, 1990 [JP] Japan ................... 2-242269

[51] Int. Cl.⁵ .............. H01L 29/94; H01L 29/76; H01L 29/00; H01L 31/062
[52] U.S. Cl. ................... 257/410; 257/411; 257/500; 257/392; 257/370
[58] Field of Search .......... 257/410, 411, 500, 392, 257/370

[56] References Cited
U.S. PATENT DOCUMENTS 3,696,276 10/1972 Boland ..................... 257/411
5,034,798 7/1991 Ohsima .................... 257/411

Primary Examiner—Rolf Hille
Assistant Examiner—Wael Fahmy
Attorney, Agent, or Firm—Foley & Lardner

[57] ABSTRACT

A semiconductor device, comprises a semiconductor substrate, a digital element part as a pair of MOS transistors formed on the semiconductor substrate; and an analog element part as a pair of MOS transistors formed on the semiconductor substrate, wherein a gate insulator film of the analogue element part comprises at least a first silicon oxide film and a silicon nitride film, a gate insulator film of the digital element part comprises a second silicon oxide, and the gate insulation film of the analogue element part is thicker than the gate insulation film of the digital element part. A fabrication method of the semiconductor device also is described.

3 Claims, 5 Drawing Sheets

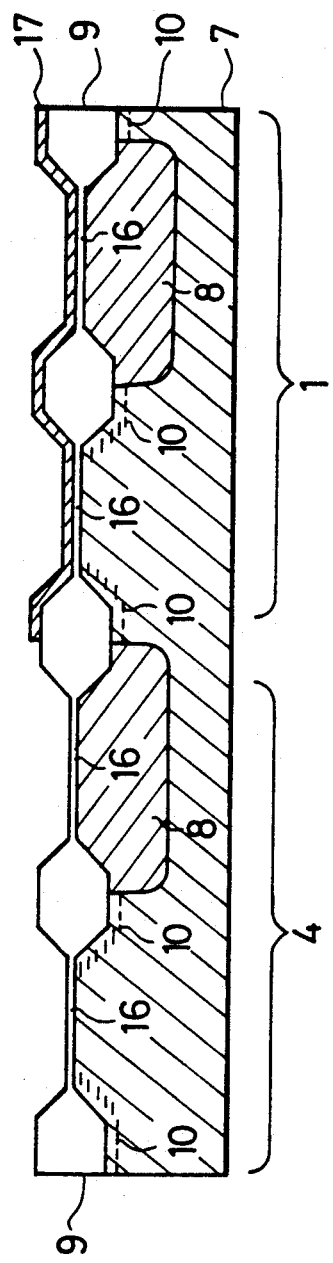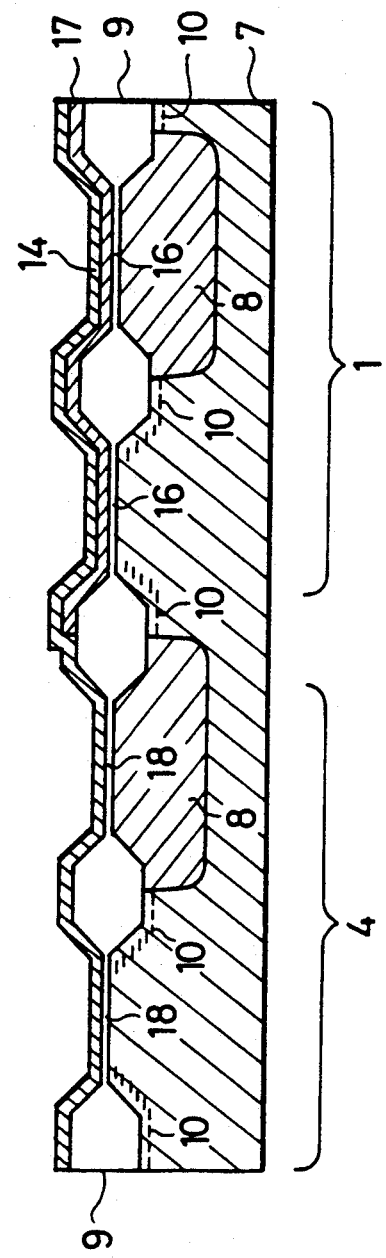

SEMICONDUCTOR DEVICE COMPRISING AN ANALOGUE ELEMENT AND A DIGITAL ELEMENT

BACKGROUND OF THE INVENTION

1. Field of the Invention

The present invention relates to a semiconductor device provided with an analogue element part and a digital element part formed as a pair of insulated gate transistors on the same semiconductor substrate, and to a method for fabricating the semiconductor device.

2. Description of the Prior Art

Conventionally, insulated gate transistor technology (hereinafter, MOS technology), and, in particular, the complementary-type insulated gate transistor technology (hereinafter, CMOS technology) and the N-channel type insulated gate transistor (NMOS transistor) technology are the main types of technology for fabricating silicon devices at the present time. In these technologies, the development of miniaturization, together with a high degree of integration and conversion to high speed, have shown steady progress and these features are being widely adopted for all types of equipment. The development of these technologies has been mainly in the application to digital circuits and the digital operation of digital ICs and the like. Along with the advancement of miniaturization, the conversion to low voltage power sources has also been implemented for use in these circuits.

In addition, taking full advantage of the low power consumption, which is one of the features of CMOS, the fabrication of parts such as analogue circuits, analogue ICs, and the like which perform an analogue operation, has made considerable progress using MOS technology, and the use of these parts in finished products is rapidly expanding.

Accordingly, an example of a single semiconductor device in which an analogue element part and a digital element part formed by CMOS on the same chip will now be explained with reference to the drawings.

FIG. 1 is a sectional view of this semiconductor device. An N-channel type MOS transistor 2 and a P-channel type MOS transistor 3 of an analogue element part 1 are formed on the right side of the drawing, and an N-channel type MOS transistor 5 and a P-channel type MOS transistor 6 of a digital element part 4 are formed on the left side of the drawing.

Also shown on the drawing are a P-type silicon substrate 7; a plurality of N-well diffusion layers 8 provided in the silicon substrate 7; a plurality of field-oxidized films 9 provided at each separation on the silicon substrate 7; a plurality of P− reversal prevention layers 10 formed along the field-oxidized films 9; a plurality of N+ diffusion layers 11 formed on the silicon substrate 7 between the field-oxidized films 9; a plurality of P+ diffusion layers 12 formed on the N-well diffusion layers 8 between the field-oxidized films 9; a plurality of boron-phosphorus silicate glass films 13 (hereinafter BPSG film) formed on each of the diffusion layers 11, 12 and the silicon substrate 7, and also on the field-oxidized films 9; a plurality of N+ polysilicon films 14 which are provided to form a gate in each of the BPSG films 13 on the silicon substrate 7; and aluminum wiring 15 in a plurality of positions.

When the analogue element part 1 and the digital element part 4 are formed by CMOS technology on the same chip in this manner, the analogue element part 1 is provided on the peripheral part of the chip, and the dense digital element part 4 is provided at the core section of the chip.

Aiming at high speed and high integration in the digital element part 4, miniaturization including a gate oxidized film is proceeding rapidly, and large-scale digital circuits containing from several thousands to over ten thousand gates are not being fabricated.

In order to fabricate a miniaturized, normal digital element part 4, the analogue element part 1 is formed before the digital element part 4. In addition, when it is desired to fabricate an analogue element part 1 such as an analogue circuit or analogue IC using CMOS technology, for example, when an inverter operation is considered, a linear (analogue) region on a characteristic curve capable of being activated is small. For this reason, when a low voltage power source (for example $V_{HH}=5$ V) is adopted as a power source, a large operating margin is considered impossible to obtain.

Accordingly, the gate oxidized film must be thick, the surface density must be reduced, and, in addition, a high voltage power source of 9 to 10 V must be adopted. Further, to form the digital element part 4 after the analogue element part 1 is formed, various types of treatment such as oxidized film etching and heat treatment and the like are required during the forming of the digital element part 4 and this results in electrically weak parts A being produced. For this reason, leak current is increased, or the gate tolerance to pressure is reduced, or the like, so that there is little margin with respect to both yield and reliability, which is a drawback.

SUMMARY OF THE INVENTION

Accordingly, an object of the present invention is to provide, with due consideration to the drawbacks of such conventional devices, a semiconductor device provided with an analogue element part and a digital element part formed as a pair of insulated gate transistors on the same semiconductor substrate, while maintaining the yield and reliability of the analogue element part and ensuring the performance and yield or reliability of the digital element part, and to provide a method for fabricating this semiconductor device.

This object is achieved in the present invention by the provision of a semiconductor device formed from an analogue element part and a digital element part as a pair of insulated gate transistors on the same semiconductor substrate, wherein the gate insulation film of the analogue element part comprises at least a silicon nitride film and a first silicon oxide film; the gate insulation film of the digital element part comprises a second silicon oxide film; and the gate insulation film of the analogue element part is thicker than the gate insulation film of the digital element part.

In addition, the thickness of the second silicon oxide film is less than the thickness of the first silicon oxide film, and the thickness of the first silicon oxide film is 500 angstrom or greater.

Next, the object of the present invention is further achieved by the provision of a method of fabricating the semiconductor device of the present invention comprising a process whereby the first silicon oxide film is formed on the part on which the analogue element part and the digital element part are formed as insulated gate transistors on the semiconductor substrate, and the silicon nitride film is successively formed on the first silicon oxide film; a process whereby, following the above-mentioned process, the silicon nitride film formed on the digital element part is removed, the first silicon oxide film formed on the digital element part is removed using the remaining silicon nitride film as a mask; and a process whereby the second silicon oxide film is formed on the digital element part from which the films have been removed.

In addition, the object of the present invention is further achieved by the provision of a method of fabricating the semiconductor device of the present invention comprising a process whereby the first silicon oxide film is formed on the part on which the analogue element part and the digital element part are formed as insulated gate transistors on the semiconductor substrate, and the silicon nitride film is successively formed on the first silicon oxide film; a process whereby following the above-mentioned process, the silicon nitride film formed on the digital element part is removed, the first silicon oxide film formed on the digital element part is removed using the remaining silicon nitride film as a mask; a process whereby the second silicon oxide film is formed on the digital element part from which the films have been removed; a process whereby a gate electrode forming film is formed on the silicon nitride film and the second silicon oxide film; and a process whereby the gate electrode forming film, the silicon nitride film, the first silicon oxide film, and the second silicon oxide film which have been laminated are etched using a mask, and the gate electrodes of the analogue element part and the digital element part and the gate insulation film are formed.

The method for fabricating the semiconductor device of the above-mentioned configuration is simple and easily implemented because the gate insulation film and the gate electrodes for the analogue element part and the digital element part are formed during the same process. Accordingly, no afterprocessing is required for the digital element part so there are no electrically weak parts in the gate section of the analogue element part, and it is also possible to provide a thicker film for the gate insulation film of the digital element part than the film used for a conventional semiconductor device. A power source with a high voltage is therefore readily adopted and it is possible to obtain a large operating margin. As a result, the yield and reliability of the analogue element part can be maintained and the performance and yield or reliability of the digital element part can be ensured.

Other features of this invention will become apparent in the course of the following description of exemplary embodiments which are given for illustration of the invention and are not intended to be limiting thereof.

BRIEF DESCRIPTION OF THE DRAWINGS

FIGS. 2A to 2D are sectional diagrams of a semiconductor device showing steps of fabricating thereof, as a preferred embodiment according to the present invention;

DETAILED DESCRIPTION OF THE PREFERRED EMBODIMENTS

Figure 4:
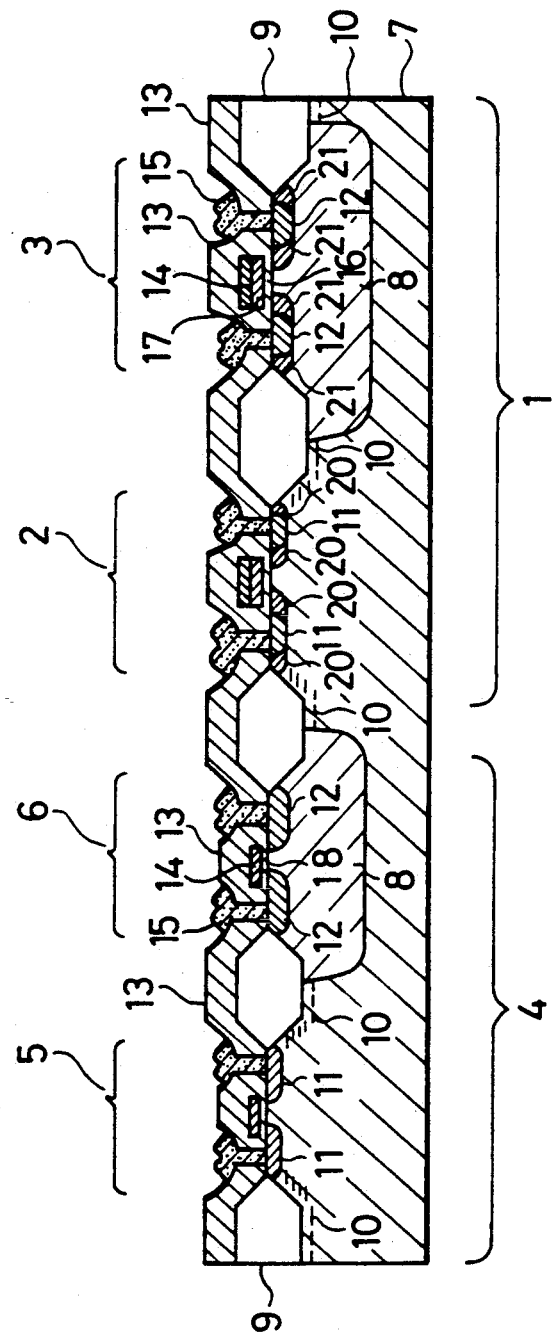
FIG. 4 is a sectional diagram of a semiconductor device as another embodiment according to the present invention.

An embodiment of the present invention will now be described with reference to FIGS. 2A to 2D and to FIG. 4. The reference numerals used in the description of the conventional device are used to designate identical or corresponding parts in this embodiment of the present invention, therefore further explanation of these parts is omitted, and only the differences in the configurations will be explained.

Figure 1:
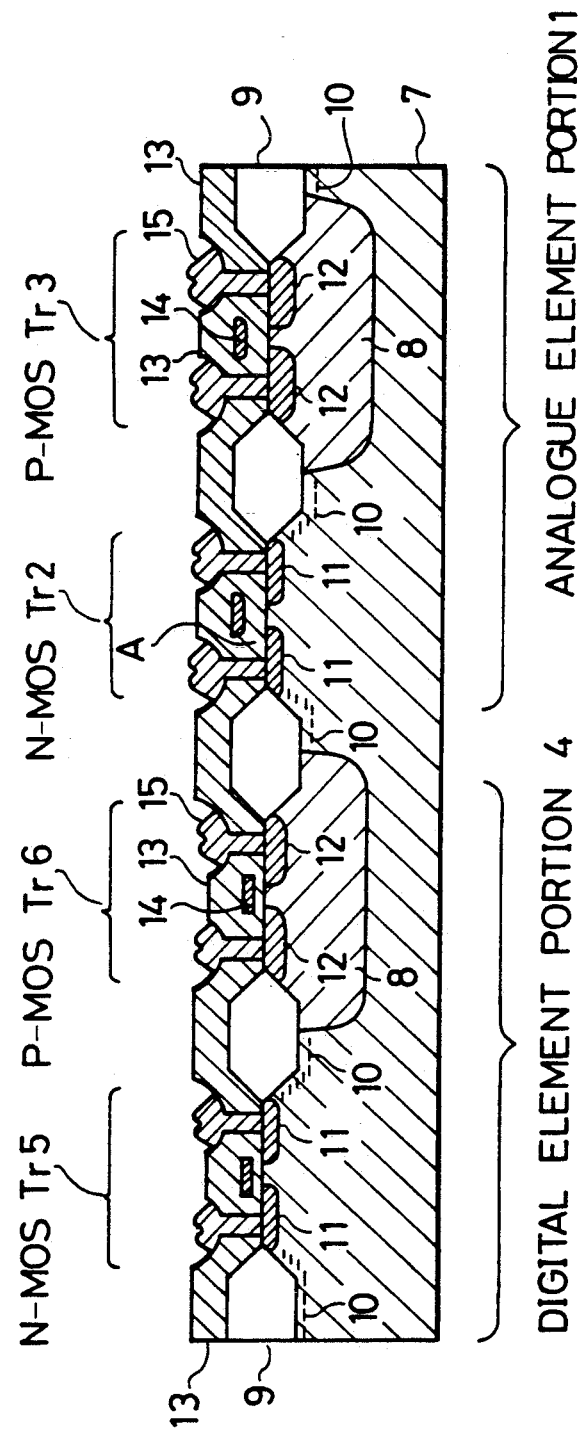
FIG. 1 is a sectional diagram of a conventional semiconductor device.
Figure 2C:
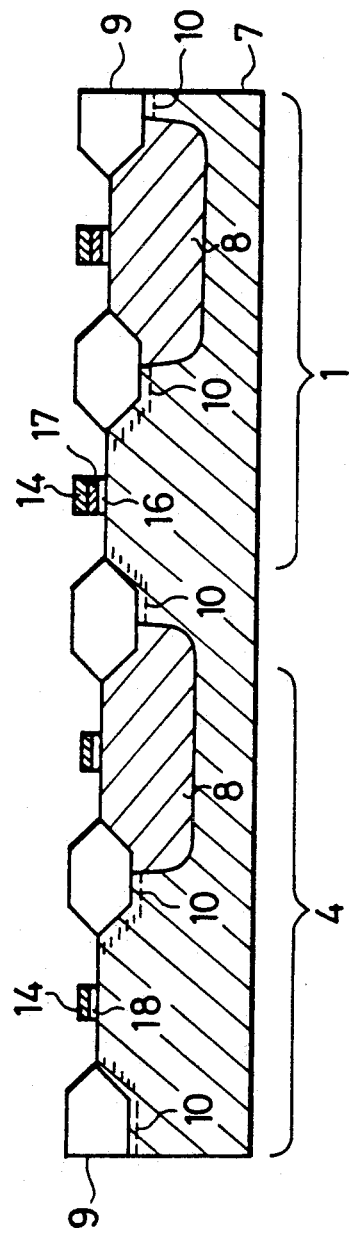
Figure 2D:
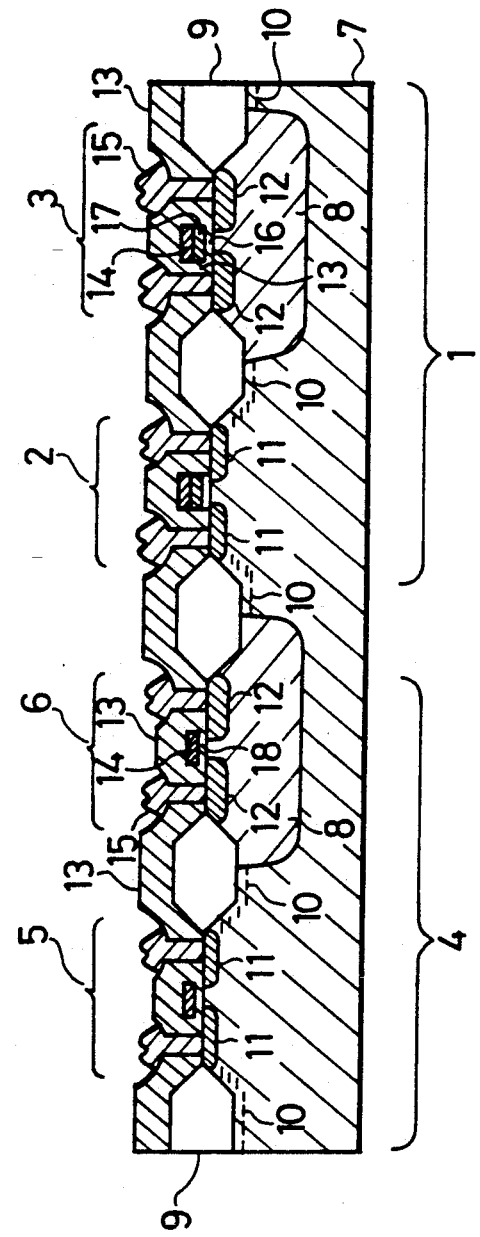

FIGS. 2A to 2D are process drawings illustrating the fabricating method for a first embodiment of a semiconductor device according to the present invention. Specifically, FIG. 2D shows a first embodiment of the present invention, corresponding to the conventional semiconductor device of FIG. 1. The gate insulation film for the analogue element part 1 comprises a first silicon oxide film 16 with a thickness of 700 angstrom and a silicon nitride film 17, also with a thickness of 700 angstrom. The gate insulation film for the digital element part 4 comprises a second silicon oxide film 18 with a thickness of 450 angstrom. The process for fabricating the semiconductor device with this configuration will now be described. Where commonly known means are used in the fabricating process a detailed explanation is omitted.

In FIG. 2A, the upper surface of a P-type silicon substrate 7 with a resistivity of approximately 20Ω cm is oxidized and the sections in the formed oxidized film at which it is intended to form the P-channel type MOS transistors 3, 6 are left open. In these open sections, phosphorus is thermally diffused at 1200° C. to form the N-well diffusion layers 8, and the oxidized film on the upper surfaces of the silicon substrate 7 and the N-well diffusion layers 8 is removed.

Next, by means of, for example, a selective oxidation method which is a commonly used element separation method, the field oxidized films 9 and the P− reversal prevention layers 10 are formed at the parts outside the region of the N-well diffusion layers 8 directly below the field oxidized films 9, using a silicon nitride film as an oxidation mask. Next, the first silicon oxide film 16 is formed in an atmosphere of $HCl/O_2$ at 950° C. to a thickness of 700 angstrom on the surface of the silicon substrate 7 on which the field oxidized films 9 and the like have been formed, then a silicon nitride film 17 is formed to a thickness of 700 angstrom on the first silicon oxide film 16. Following this, selective removal of only the silicon nitride film 17 on the part on which the digital element part 4 has been formed is implemented.

As shown in FIG. 2B, the part of the first silicon oxide film 16 formed on the digital element part 4 is removed using the silicon nitride film 17 as a mask. The second silicon oxide film 18 is formed in an atmosphere of $HCl/O_2$ at 950° C. to a thickness of 450 angstrom on the part on which the digital element part 4 is formed and from which the first silicon oxide film 16 has been removed, then a boron implantation is performed on various resist blocks to control the threshold voltage $V_{th}$ at the analogue element part 1 and the digital element part 4.

An undoped polycrystalline silicon film is then built up to a thickness of 4000 angstrom on the upper surface of the above-mentioned formed silicon substrate 7, after which phosphorus is thermally diffused at 950° C. and an N+ polysilicon film 14 is formed. In FIG. 2C, a photoresist is used as a mask, and a pattern is formed on the gate part of the N+ polysilicon film 14. Then the silicon nitride film 17 and the first silicon oxide film 16, as well as the second silicon oxide film 18, are etched by the reactive ion etching method (hereinafter, RIE method). In this manner, the gate electrodes and gate insulation films of the analogue element part 1 and the digital element part 4 are formed simultaneously.

In FIG. 2D, an arsenic implantation is performed on the source drain region of the N-channel type MOS transistors 2, 5 on the surface of the exposed silicon substrate 7 using a resist as a mask, then oxidation is carried out in an atmosphere of $O_2$ at 900° C. In addition, a boron implantation is performed on the source drain region of the P-channel type MOS transistors 3, 6 using resist as a mask. Next, by means of the chemical vapor deposition method (CVD method) the BPSG film 13 is built up consecutively on the surface of the above-mentioned formed silicon substrate 7, and phosphorus gettering is implemented at 950° C. As a result, the high density implantation layers formed by the implementation of the arsenic and boron implantation is activated, and become the N+ diffusion layers 11 and the P+ diffusion layers 12. The BPSG film 13 is then etched using the RIE method with a resist mask, and contact holes are opened in the upper surfaces of the N+ diffusion layers 11 and the P+ diffusion layers 12 and the like.

Following this, sputtering and patterning of Al-Si (1.2%) is implemented on the contact holes and the BPSG film and the like to form the electrodes and the wiring from a metal compound, and an Al sintering process is activated in a forming gas atmosphere of $N_2/H_2$ at 450° C. over about a 15 minute period, to form the Al wiring 15. The first embodiment of the present invention is fabricated using the above process. Because it is possible to form the analogue element part 1 and the digital element part 4 simultaneously, this embodiment is easily manufactured. Further, there are no electrically weak parts produced during the conventional formation of the digital element part 4, specifically, during various types of treatment such as the oxidized film etching and heat treatment and the like. As a result, increased leak current, reduced gate tolerance to pressure, or the like, do not occur, and it is possible to obtain a large margin in both yield and reliability.

It is also possible to provide a thicker film for the gate insulation film of the analogue element part at the first silicon oxide film 16 and the silicon nitride film 17, and to readily adopt a power source with a high voltage of 9 to 10 V, to obtain a large operating margin.

In addition, even when the digital element part 4 is being formed there is no particular necessity to consider the effect on the analogue element part 1, and there is no loss of yield or reliability by providing high integration and high speed.

Figure 3:
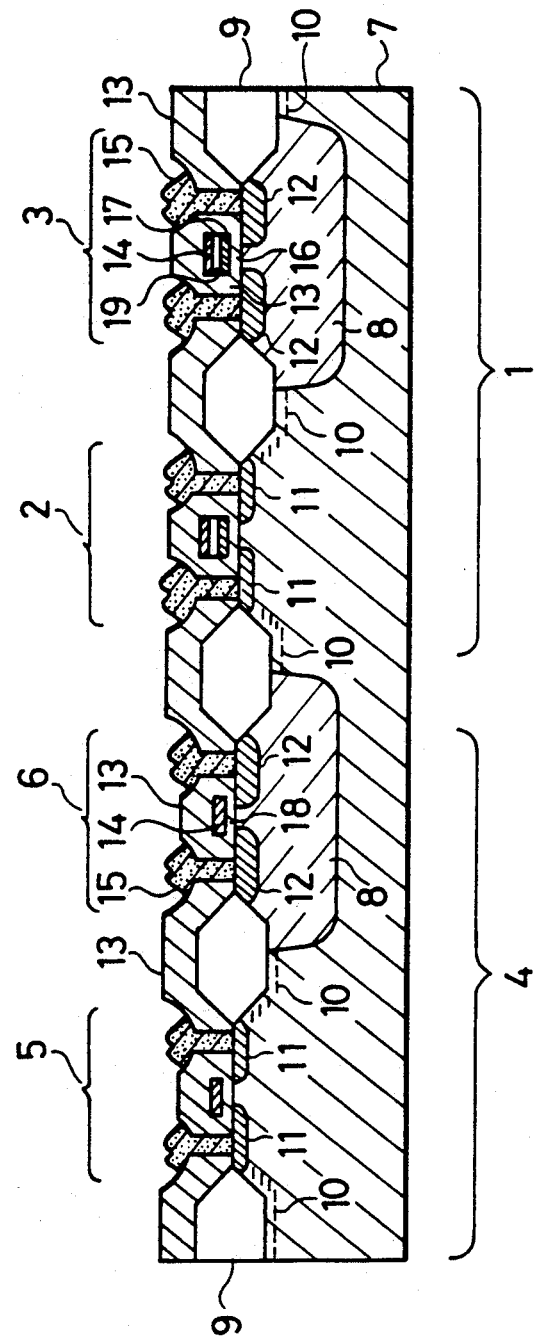
FIG. 3 is a sectional diagram of a semiconductor device as another embodiment according to the present invention.

In this embodiment, the thickness of the first silicon oxide film 16 of the analogue element part 1 is 700 angstrom, but the same effect is obtained with a thickness of 500 angstrom. However, if the film thickness is less than 500 angstrom the performance will be inadequate in the case, for example, where an amplifier circuit is formed and an analogue operation is carried out. A second embodiment of the present invention will now be explained. FIG. 3 is a sectional view of a second embodiment of the semiconductor device of the present invention. In this embodiment, the structure of the gate insulation film of the analogue element part 1 differs from that of the first embodiment. This gate insulation film comprises the first silicon oxide film 16, the silicon nitride film 17, and a thin-film third silicon oxide film 19.

To fabrication of this embodiment, in FIG. 2B, which shows the fabricating process for the first embodiment, the part of the first silicon oxide film 16 on which the silicon nitride film 17 is masked and the digital element part 4 is formed, is removed. Then, on the part from which the first silicon oxide film 16 has been removed, the second silicon oxide film 18 is formed to a thickness of 450 angstrom, and simultaneously the thin-film third silicon oxide film 19 is formed on the silicon nitride film 17. The subsequent processing is the same as for the first embodiment.

The same effect is obtained in the second embodiment as in the first embodiment, but in addition, in the fabricating process, the step to form only the digital element part 4 when the second silicon oxide film 18 is formed may be omitted, and the gate insulation film of the analogue element part 1 is made thicker by the addition of the third silicon oxide film 19.

A third embodiment of the present invention will now be explained. FIG. 4 is a sectional view of a third embodiment of the semiconductor device of the present invention. This embodiment differs from the first embodiment inasmuch as, in the source drains of the N-channel type MOS transistor 2 and the P-channel type MOS transistor 3 of the analogue element part 1, an N-diffusion layer 20 and a P− diffusion layer 21 are provided adjacent to each of the N+ diffusion layers 11 and the P+ diffusion layers 12, respectively. The same effect is obtained in this third embodiment as in the first embodiment, but in addition, it is possible to reduce hot carriers moved from the silicon substrate 7 to the gate, so that higher reliability can be provided, and it is possible to provide a power source with high voltage for the analogue element part 1.

Furthermore, in each of the above-described embodiments, an N+ polysilicon film 14 is used in forming the gate electrodes, but it is also possible to use a metal silicide with a high melting point, or a combination of a metal silicide with a high melting point and an N+ polysilicon film, or the like.

Various modification will become possible for those skilled in the art after the teaching of the present disclosure without departing from the scope thereof.

What is claimed is:

1. A semiconductor device, comprising:
    a semiconductor substrate;
    a digital element part as a pair of MOS transistors formed on the semiconductor substrate; and
    an analog element part as a pair of MOS transistors formed on the semiconductor substrate,
    wherein a gate insulator film of the analog element part comprises at least a first silicon oxide film and a silicon nitride film, a gate insulator film of the digital element part comprises a second silicon oxide, and the gate insulation film of the analogue element part is thicker than the gate insulation film of the digital element part, and wherein the thickness of the second silicon oxide film is less than the thickness of the first silicon oxide film.

2. A semiconductor device according to claim 1, wherein the thickness of the first silicon oxide film is not less than 500 angstrom.

3. A semiconductor device, comprising:
    a semiconductor substrate;
    a digital element part as a pair of MOS transistors formed on the semiconductor substrate; and an analog element part as a pair of MOS transistors formed on the semiconductor substrate,
wherein a gate insulator film of the analog element part comprises at least a first silicon oxide film, a silicon nitride film, and a third silicon oxide film, the third silicon oxide film is thinner than the first silicon oxide film, and a gate insulator film of the digital element part comprises a second silicon oxide, and the gate insulation film of the analogue element part is thicker than the gate insulation film of the digital element part.

* * * * *